(12) United States Patent
Zang et al.

(10) Patent No.: US 10,580,701 B1
(45) Date of Patent: Mar. 3, 2020

(54) METHODS OF MAKING A SELF-ALIGNED GATE CONTACT STRUCTURE AND SOURCE/DRAIN METALLIZATION STRUCTURES ON INTEGRATED CIRCUIT PRODUCTS

(71) Applicant: GLOBALFOUNDRIES Inc., Grand Cayman (KY)

(72) Inventors: Hui Zang, Guilderland, NY (US); Scott Beasor, Greenwick, NY (US); Haiting Wang, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/168,441

(22) Filed: Oct. 23, 2018

(51) Int. Cl.
  *H01L 21/8234* (2006.01)
  *H01L 27/088* (2006.01)
  *H01L 29/78* (2006.01)
  *H01L 29/66* (2006.01)

(52) U.S. Cl.
  CPC ........... *H01L 21/823437* (2013.01); *H01L 21/823418* (2013.01); *H01L 21/823431* (2013.01); *H01L 21/823468* (2013.01); *H01L 27/0886* (2013.01); *H01L 29/66545* (2013.01); *H01L 29/66795* (2013.01); *H01L 29/7851* (2013.01)

(58) Field of Classification Search
  CPC ..... H01L 21/823437; H01L 21/823431; H01L 29/66795; H01L 21/823418; H01L 29/66545; H01L 21/823468; H01L 27/0886; H01L 29/7851
  See application file for complete search history.

(56) References Cited

U.S. PATENT DOCUMENTS

| | | |
|---|---|---|
| 5,256,274 A | 10/1993 | Poris |
| 5,270,554 A | 12/1993 | Palmour |
| 5,368,711 A | 11/1994 | Poris |
| 6,087,235 A | 7/2000 | Yu |
| 6,184,129 B1 | 2/2001 | Hwang et al. |
| 6,210,991 B1 | 4/2001 | Wenham et al. |
| 6,686,616 B1 | 2/2004 | Allen et al. |
| 2006/0292716 A1 | 12/2006 | Gu et al. |
| 2013/0277680 A1 | 10/2013 | Green et al. |

*Primary Examiner* — Anthony Ho
(74) *Attorney, Agent, or Firm* — Amerson Law Firm, PLLC

(57) ABSTRACT

A method of forming a gate structure in a gate cavity laterally defined by a sidewall spacer and recessing the sidewall spacer so as to form a recessed sidewall spacer with a recessed upper surface is disclosed. In this example, the method also includes performing at least one etching process to form a tapered upper surface on the exposed portion of the gate structure above the recessed upper surface of the spacer and forming a gate cap above the tapered upper surface of the gate structure and above the recessed upper surface of the recessed sidewall spacer.

16 Claims, 14 Drawing Sheets

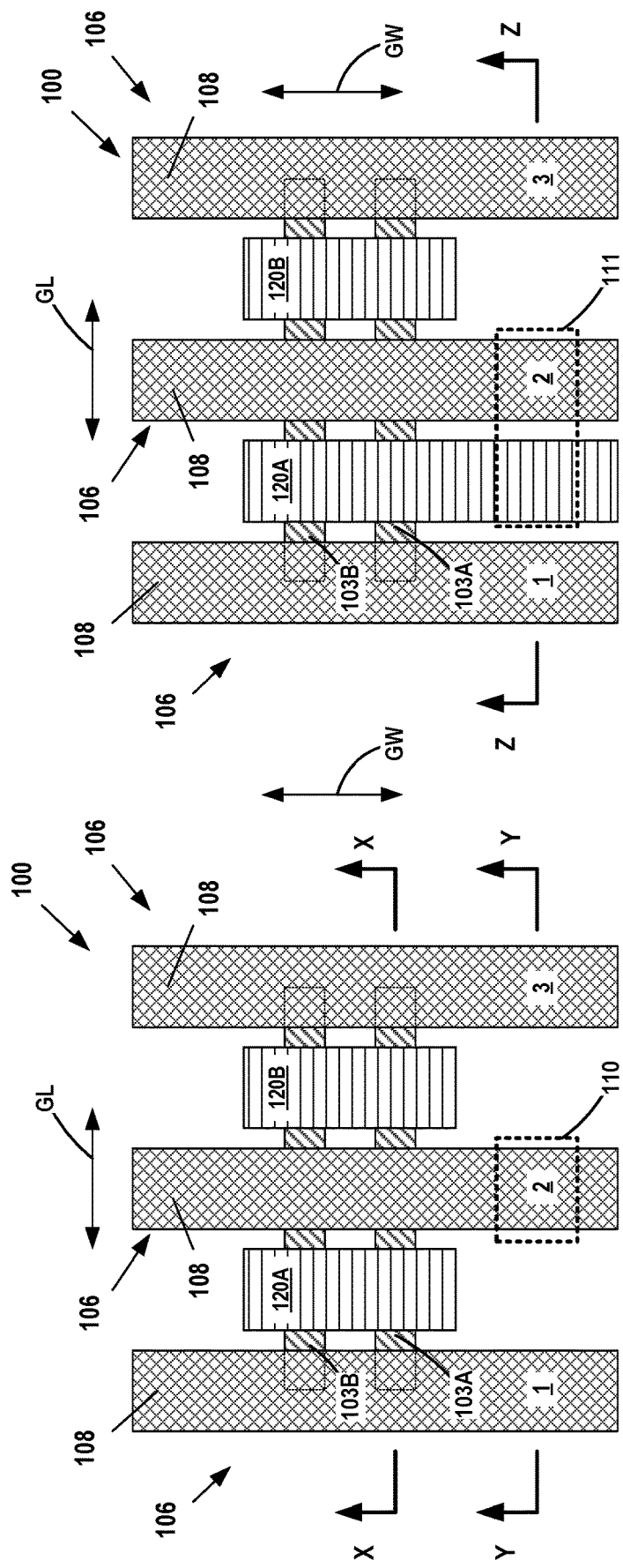

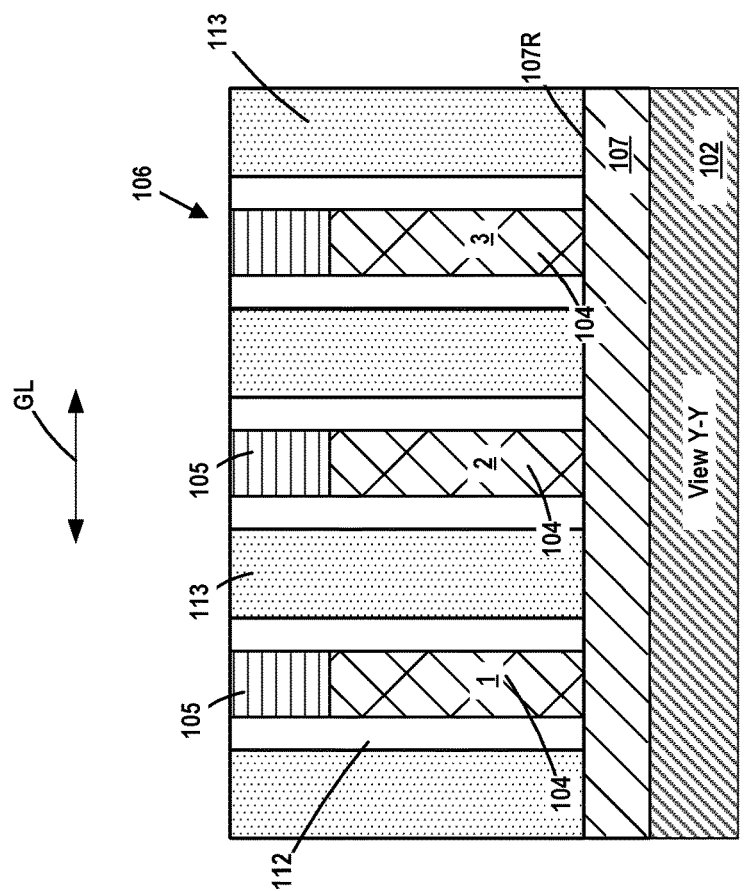
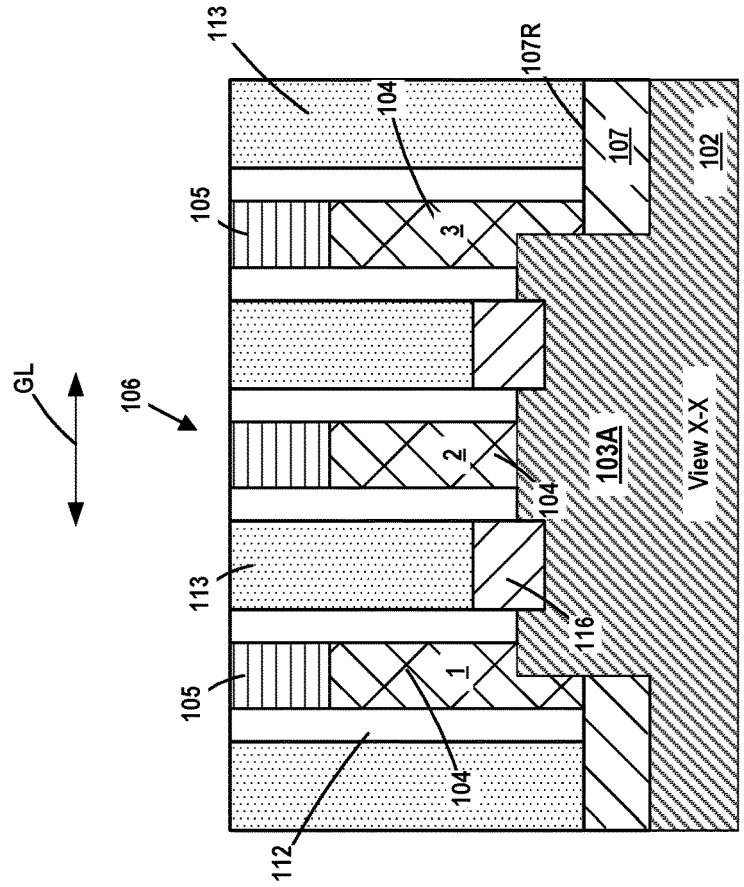

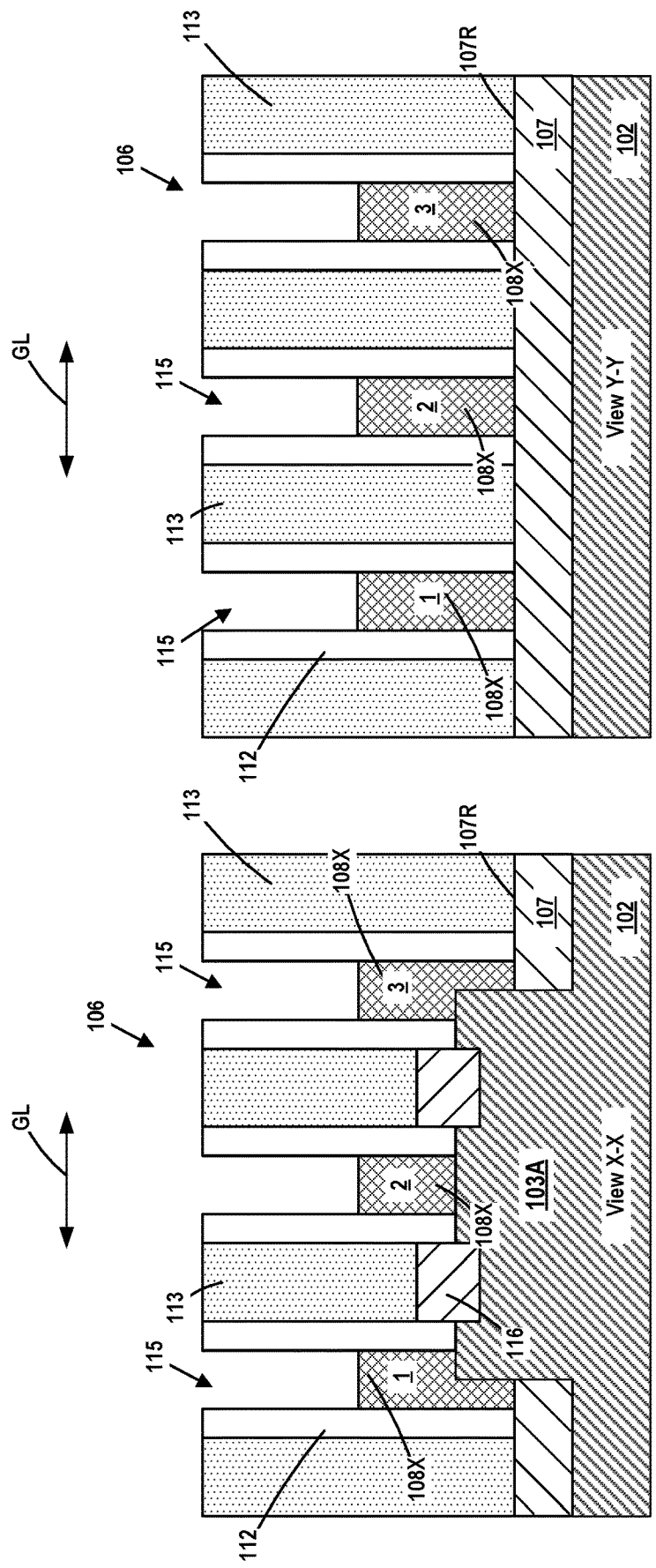

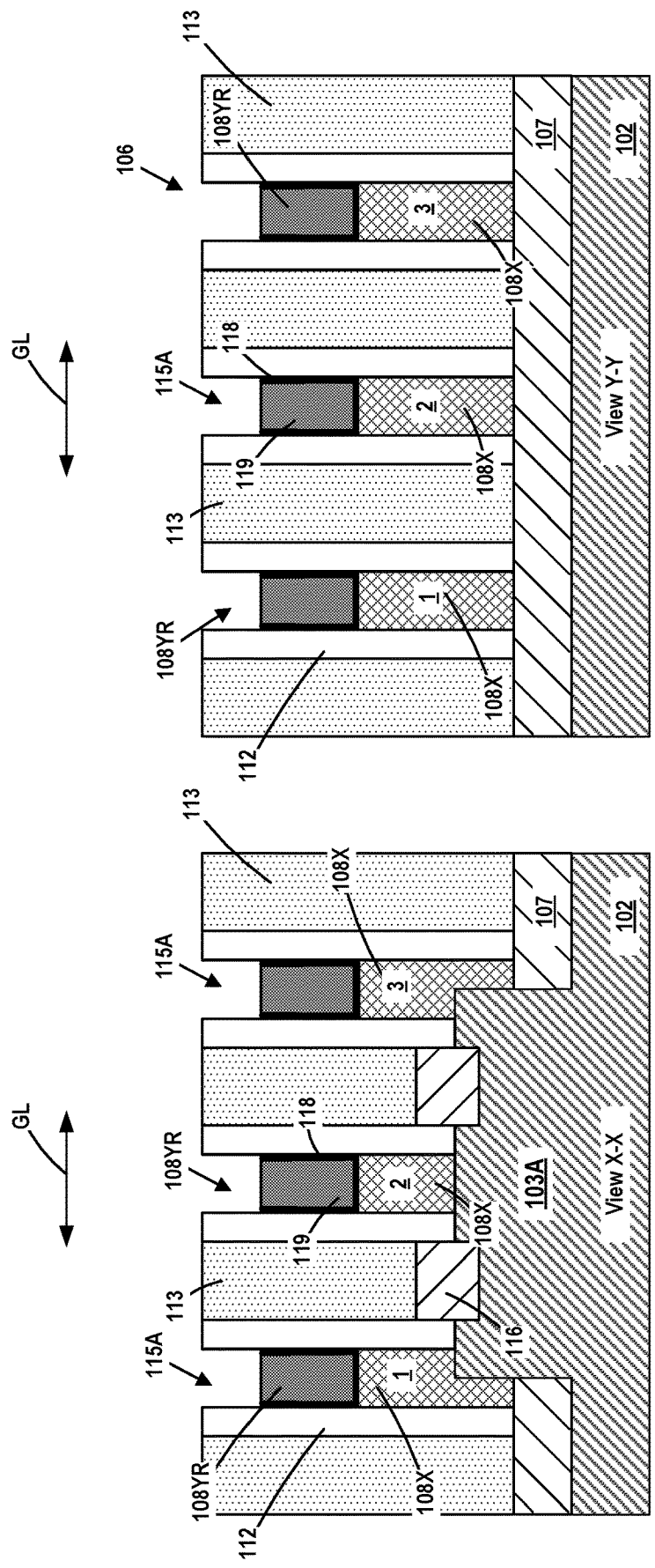

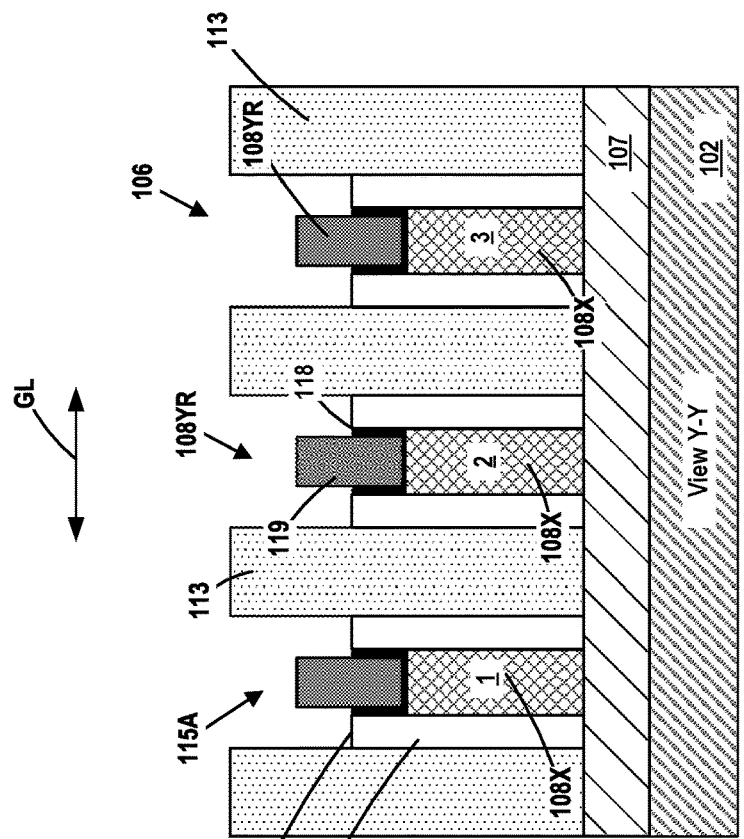
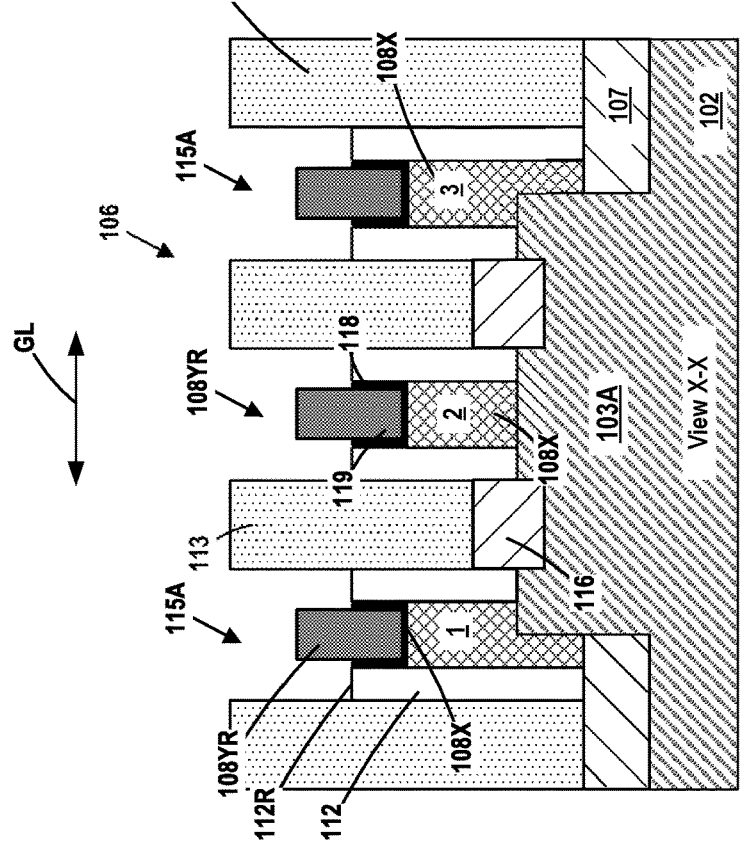
Fig. 13
Fig. 14

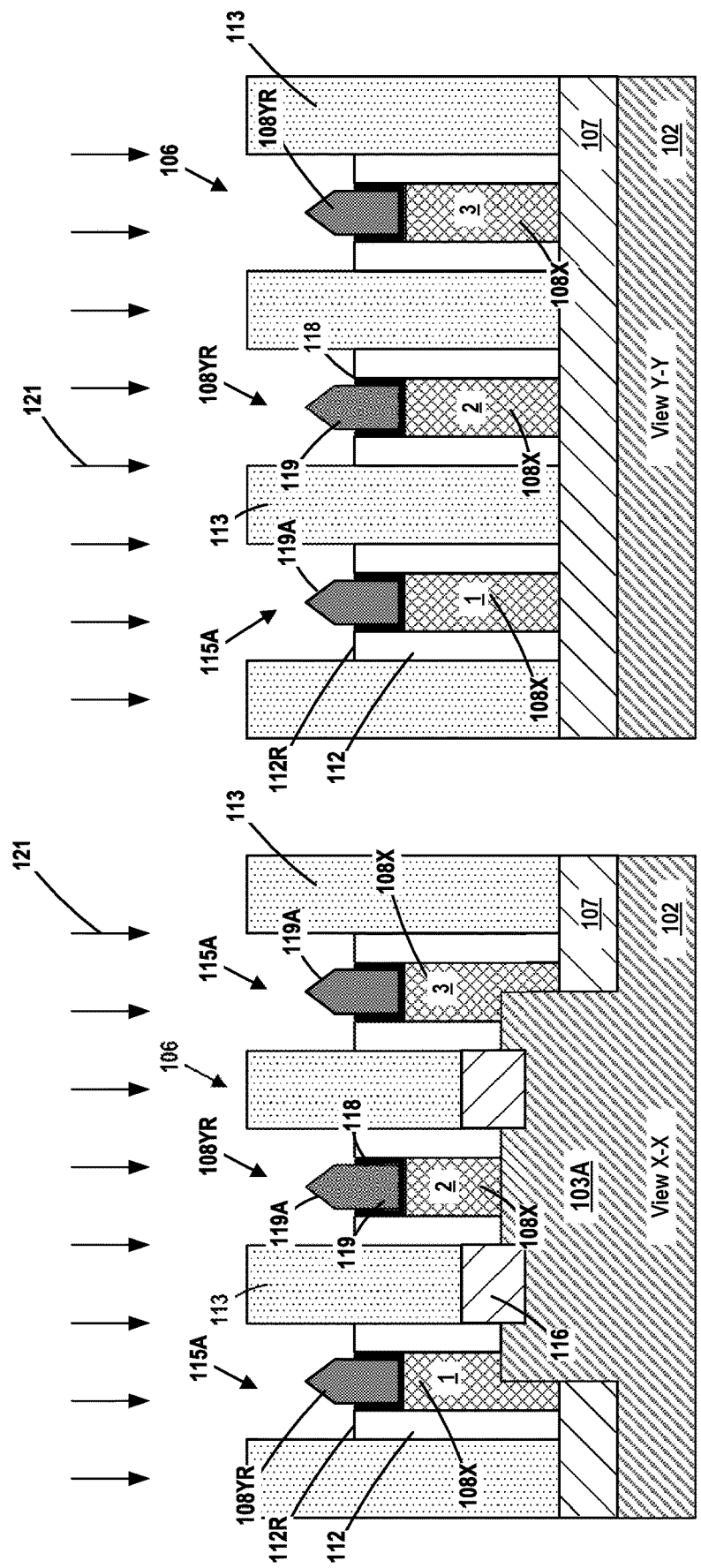

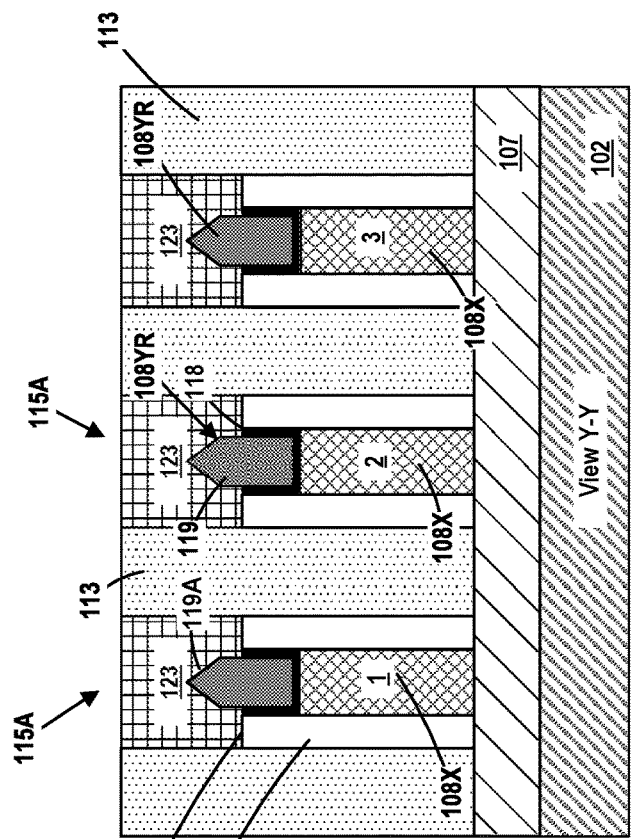
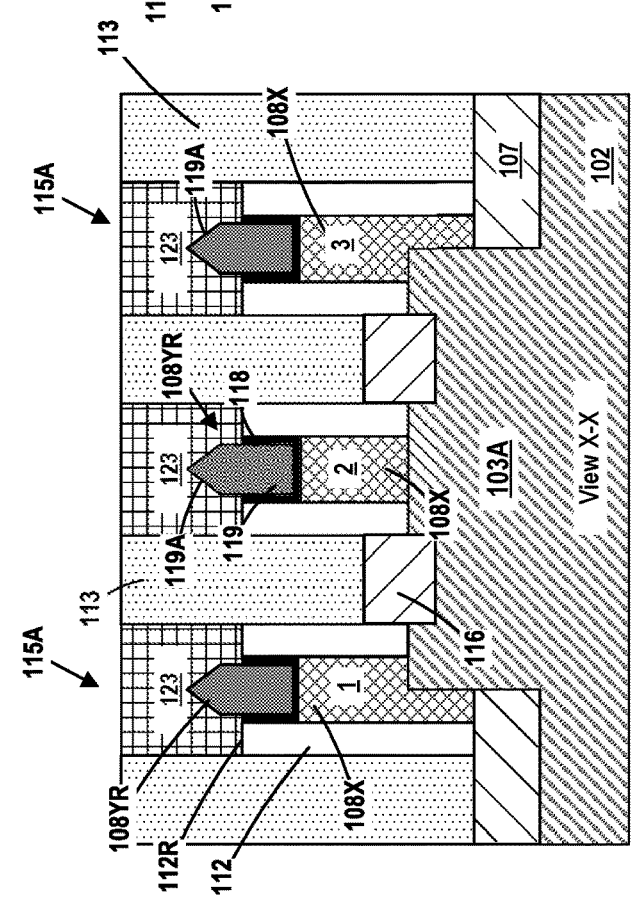

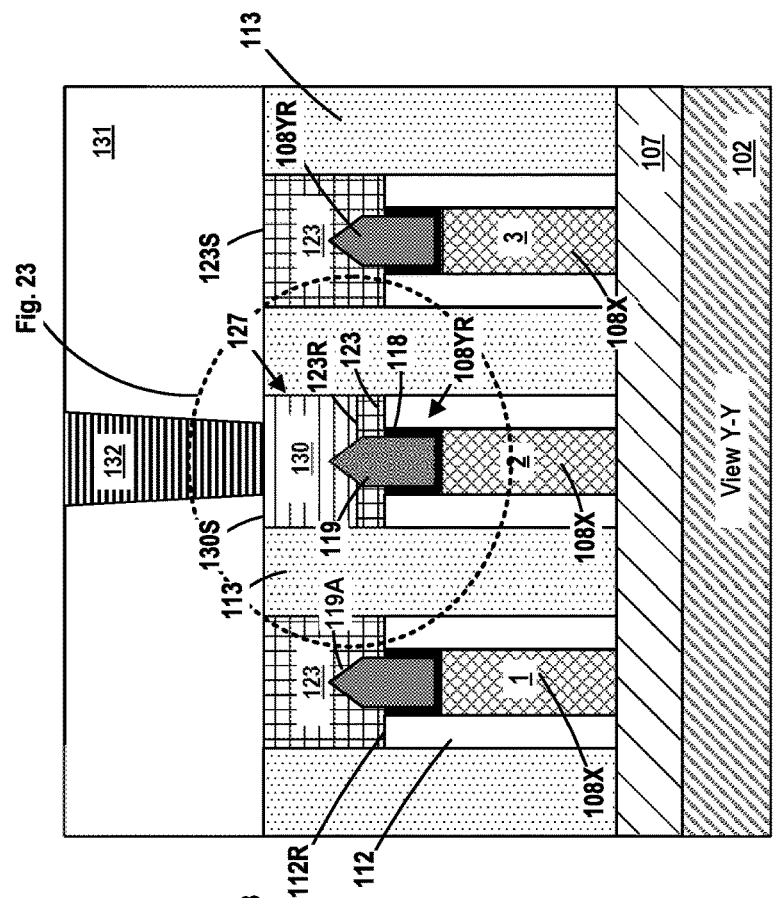
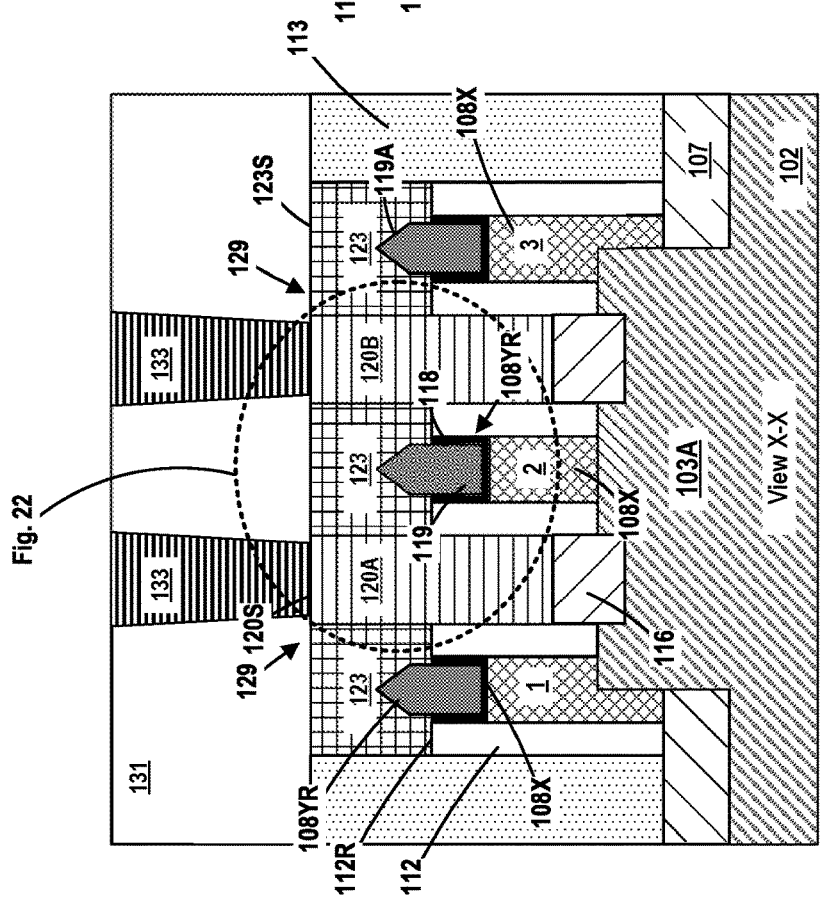
Fig. 21
Fig. 22

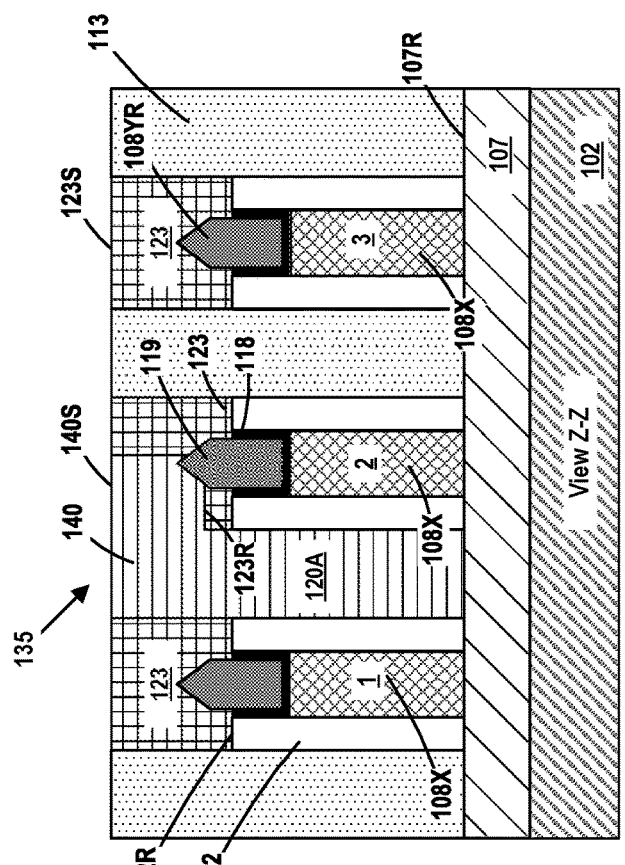
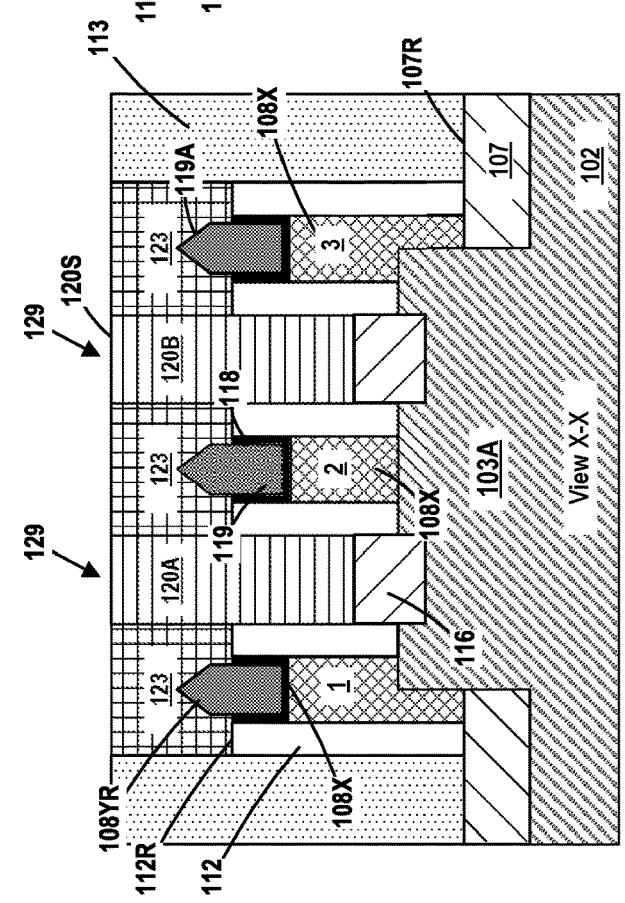
Fig. 28
Fig. 27

METHODS OF MAKING A SELF-ALIGNED GATE CONTACT STRUCTURE AND SOURCE/DRAIN METALLIZATION STRUCTURES ON INTEGRATED CIRCUIT PRODUCTS

BACKGROUND

1. Field of the Disclosure

The present disclosure generally relates to the fabrication of integrated circuits, and, more particularly, to various methods of making a self-aligned gate contact structure and source/drain metallization structures on integrated circuit (IC) products.

2. Description of the Related Art

In modern integrated circuits, such as microprocessors, storage devices and the like, a very large number of circuit elements, especially transistors, are provided on a restricted chip area. Field Effect Transistors ("FETs") come in a variety of shapes and forms, e.g., planar transistors, FinFET transistors, vertical transistors, nanowire devices, etc., that are formed in and above a semiconductor substrate. Some forms of transistors comprise a conductive gate structure (e.g., a gate insulation (dielectric) layer and a conductive gate electrode) and source/drain regions positioned on opposite sides of the gate structure. An insulating gate cap and an insulating sidewall spacer are formed above and adjacent the gate structure to electrically isolate the gate structure from surrounding conductive structures. A channel region exists in the semiconductor substrate under the gate structure and between the source/drain regions. A transistor also typically includes source/drain metallization structures, e.g., so-called "trench silicide" (TS) structures, each of which conductively contacts an underlying source/drain region. In some devices, the source/drain metallization structures are line-type features that extend across the entire active region of the device in a direction that is parallel to the axial length of the gate structure. The state of the field effect transistor is controlled by a gate electrode, which controls, upon application of an appropriate control voltage, the conductivity of a channel region formed between a drain region and a source region.

Various conductive contacts must be formed to establish electrical connection to components of the transistor. For example, a gate contact structure is typically formed for establishing electrical contact to the gate structure and a separate S/D contact structure is formed for establishing electrical contact to each of the source/drain metallization structures of the transistor. Typically, the gate contact structure is positioned vertically above isolation material that surrounds the device, but that may not be the case in some applications, e.g., the gate contact may be positioned above the active region of the transistor in some advanced architectures. The gate contact structure and the source/drain contact structures are typically considered to be device-level contacts within the industry.

If an undesired electrical short is established between the gate structure and one of the source/drain metallization structures, the transistor may not operate as intended or it may not operate at all. Thus, care is taken to make sure that there is a required minimum spacing between the gate contact and the source/drain metallization structures so as to avoid or reduce the chances of creating an electrical short between the gate contact structure and the source/drain metallization structures, i.e., design rules require that a minimum spacing must be maintained between the gate contact structure and the source/drain metallization structures in an attempt to prevent such undesirable electrical shorts. Unfortunately, there is an area penalty associated with the minimum spacing requirement between the gate contact structure and the source/drain metallization structures. Moreover, as device dimensions continue to shrink and packing densities continue to increase, these minimum spacing dimensions become smaller, thereby leading to greater chances of forming such undesirable electrical shorts.

The present disclosure is directed to various methods of making a self-aligned gate contact structure and source/drain metallization structures on IC products that may solve or at least reduce one or more of the problems described above.

SUMMARY

The following presents a simplified summary of the disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

Generally, the present disclosure is directed to various methods of making a self-aligned gate contact structure and source/drain metallization structures on IC products. One illustrative method disclosed herein includes forming a gate structure in a gate cavity laterally defined by a sidewall spacer and recessing the sidewall spacer so as to form a recessed sidewall spacer with a recessed upper surface, wherein recessing the sidewall spacer exposes a portion of the gate structure positioned above a level of the recessed upper surface. In this example, the method also includes performing at least one etching process to form a tapered upper surface on the exposed portion of the gate structure and forming a gate cap, the gate cap being positioned above the tapered upper surface of the gate structure and above the recessed upper surface of the recessed sidewall spacer.

One illustrative device disclosed includes a gate structure and a sidewall spacer positioned adjacent the gate structure, the sidewall spacer having an upper surface, wherein an upper portion of the gate structure is positioned above a level of the upper surface of the sidewall spacer. In this illustrative example, the device also includes a tapered upper surface on the upper portion of the gate structure and a gate cap, the gate cap being positioned above the tapered upper surface of the gate structure and above the upper surface of the sidewall spacer.

BRIEF DESCRIPTION OF THE DRAWINGS

The disclosure may be understood by reference to the following description taken in conjunction with the accompanying drawings, in which like reference numerals identify like elements, and in which:

FIGS. 1-28 depict various methods of making a self-aligned gate contact structure and source/drain metallization structures on IC products.

Figure 7:
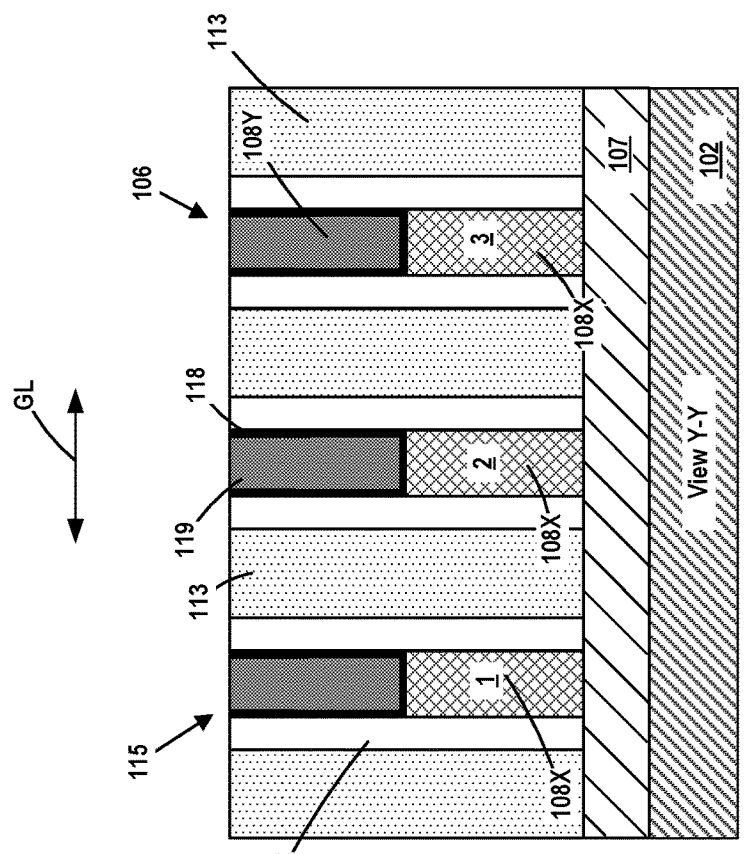

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of making a self-aligned gate contact structure and source/drain metallization structures on IC products. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, etc. In the illustrative examples depicted herein, the transistor devices will be FinFET devices. However, as will be appreciated by one skilled in the art after a complete reading of the present application, the inventions disclosed herein should not be considered to be limited to IC products that include only FinFET transistor devices, as the methods disclosed herein may be used on a variety of different types of transistor devices on a variety of different integrated circuit products. Thus, the presently claimed inventions should not be considered to be limited to any particular form of transistors. Of course, the claimed inventions should not be considered to be limited to the illustrative examples depicted and described herein. With reference to the attached figures, various illustrative embodiments of the methods and devices disclosed herein will now be described in more detail. The various layers of material described below may be formed by performing any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpreta-tion and should be interpreted to cover situations where one feature actually contacts another feature or is in close proximity to that other feature.

FIGS. 1-27 depict various methods of making a self-aligned gate contact structure and source/drain metallization structures on an IC product 100. FIG. 1 is a simplistic plan view of one illustrative embodiment of an IC product 100 that may be formed using the methods described herein. FIG. 1 depicts a plurality of fins 103A-B (collectively referenced using the numeral 103) that were formed in a semiconductor substrate 102 (see FIG. 3), as well as a plurality a plurality of gates 106 (numbered 1-3 for ease of reference) that were formed on the IC product 100 for various transistor devices. The depicted transistor device comprises two illustrative fins 103A-B. In practice, the device may comprise one or more fins 103. Each of the gates 106 comprise an illustratively depicted final gate structure 108 that will eventually be formed on the product 100. Also depicted in FIG. 1 are illustrative conductive source/drain metallization or contact structures 120A-B (collectively referenced using the numeral 120) (e.g., trench silicide structures) that will be formed so as to be conductively coupled to the source/drain regions of the transistor device. In the depicted example, gate 2 is the active gate for the transistor structure that comprises the fins 103A/B. The gates 1 and 3 are effectively non-functional gate structures as it relates to the operation of the depicted transistor device.

Still with reference to FIG. 1, various cross-sectional views ("X-X" and "Y-Y") of the product 100 that are depicted in the attached drawings are taken where indicated in FIG. 1. The cross-sectional views X-X and Y-Y are taken in the gate length (GL-current transport) direction of the transistor devices. More specifically, with reference to FIG. 1, the view X-X is a cross-sectional view taken along the long axis (i.e., the axial length) of the fin 103A. The view Y-Y is a cross-sectional view taken through a location 110 (in dashed lines) along the axial length of gate 2 where a lower gate contact structure (not shown) will be formed so to establish electrical contact to the final gate structure 108 of gate 2. In the depicted example, the location 110 may be positioned above isolation material 107 (see FIGS. 3-4) that electrically isolates the depicted transistor device from an adjacent transistor device (not shown).

FIG. 2 is an alternative embodiment of the integrated circuit product 100 wherein an elongated source/drain metallization or contact structure 120A was formed in the space between gates 1 and 2, wherein a portion of the elongated source/drain metallization or contact structure 120A is positioned laterally adjacent gate 2 and above isolation material 107 positioned between adjacent transistor devices. The view Z-Z is a cross-sectional view taken through a location 111 (in dashed lines) along the axial length of gate 2 where a combined gate/SD contact structure (not shown)—a so-called cross-coupled contact structure—will be formed that conductively couples the gate structure 108 of gate 2 to the elongated source/drain metallization or contact structure

120A. In some applications, the elongated source/drain metallization or contact structure 120A may extend across a source/drain region of multiple transistor devices that are each separated from one another by the isolation material 107.

The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

FIGS. 3-4 depict the product 100 after several process operations were performed. More specifically, the fins 103 were formed in the substrate 102 using traditional manufacturing techniques. For example, a patterned fin-formation etch mask (not shown—comprised of, for example, a layer of silicon dioxide and a layer of silicon nitride) was formed above the substrate 102. Thereafter, one or more etching processes, e.g., anisotropic etching processes, were performed through the patterned fin-formation etch mask to form a plurality of fin-formation trenches in the substrate 102 and thereby define the plurality of fins 103. The width and height of the fins 103 may vary depending upon the particular application. Additionally, the overall size, shape and configuration of the fin-formation trenches and fins 103 may vary depending on the particular application. Next, a recessed layer of insulating material 107 (e.g., silicon dioxide) with a recessed upper surface 107R was formed between the fins 103 by performing traditional manufacturing techniques. Thereafter, at least portions of the patterned fin-formation etch mask were removed.

The final gate structures 108 for the transistor devices disclosed herein will be manufactured using one illustrative embodiment of a replacement gate (or "gate-last") manufacturing technique. Accordingly, still referencing FIGS. 3-4, after the formation of the fins 103, a plurality of sacrificial (or "dummy") gate structures 104, with a sacrificial gate cap 105 formed there above, were formed across the substrate 102. In one illustrative and non-limiting process flow, each of the sacrificial structures 104 comprises a sacrificial gate insulation layer (not separately shown, e.g., silicon dioxide) and a sacrificial gate electrode material (not separately shown, e.g., polysilicon or amorphous silicon). A sacrificial gate cap 105 (e.g., silicon nitride) is positioned above each of the sacrificial gate structures 104. In one illustrative process flow, the sacrificial gate structures 104 (with the gate cap 105 there above) are initially formed as continuous line-type structures that extend across substantially the entire substrate 102, including across both active regions and isolation regions located between active regions. The long continuous line-type sacrificial gate 104/gate cap 105 structures may be formed by depositing the materials for the sacrificial gate structures 104 as well as a layer of material for the sacrificial gate caps 105 across the entire substrate 102, forming a patterned gate etch mask (not shown) above the deposited layer of the material for the sacrificial gate caps 105, and performing one or more etching processes through the patterned gate etch mask to remove the exposed portions of sacrificial gate cap material and, thereafter, the exposed portions of the sacrificial gate materials.

Next, still referencing FIGS. 3-4, a sidewall spacer structure 112 (e.g., silicon nitride, a low-k material (k value of 3.3 or less), etc.) was formed adjacent the long continuous line-type sacrificial gate structures 104 and gate caps 105. The spacer 112 may be formed by depositing a conformal layer of spacer material and thereafter performing an anisotropic etching process. Various process operations are typically performed with the sacrificial gate structures 104, gate caps 105 and spacers 112 in position, e.g., source/drain implantation processes, the formation of epi semiconductor material 116 in the source/drain regions of the transistor devices, etc. However, the epi semiconductor material 116 need not be formed in all applications. Then, a conformal contact etch stop layer (not shown, e.g., silicon nitride) was formed on the product 100 and above the epi semiconductor material 116 (if present). At that point, a layer of insulating material 113 (e.g., silicon dioxide) was blanket-deposited across the product 100 so as to over-fill the open spaces between the spacers 112. Thereafter, a CMP and/or etch-back process was performed to planarize the upper surface of the layer of insulating material 113 with the upper surface of the sacrificial gate caps 105.

FIGS. 5-6 depict the product 100 after several process operations were performed. More specifically, one or more etching processes were performed to remove the sacrificial gate caps 105 so as to expose the underlying sacrificial gate structures 104. At that point, the sacrificial gate structures 104 were removed so as to form a plurality of replacement gate cavities located laterally between the spacers 112. Thereafter, in one illustrative process flow, the materials for a lower portion 108X of the final gate structures 108 were formed in the replacement gate cavities. For example, at this point in the illustrative process flow depicted herein, the lower portion 108X of the final gate structures 108 may comprise a high-k gate insulation layer (not separately shown), such as hafnium oxide, a material having a dielectric constant greater than 10, etc., and one or more conductive work-function adjusting metal layers (not separately shown), e.g., titanium, tantalum, titanium nitride, tantalum nitride, titanium carbide, etc. In this illustrative process flow, the conductive work-function adjusting metal layer(s) constitute a lower portion of the overall conductive gate electrode of the final gate structure 108. Then, a CMP and or etch-back process was performed to remove excess amounts of the materials of the lower portion 108X of the final gate structures 108 that were positioned outside of the replacement gate cavities. At that point, one or more recess etching processes were performed to reduce the height or recess the materials (e.g., the high-k gate insulation layer and the work-function adjusting material(s)) of the lower portion 108X of the final gate structures 108 within the replacement gate cavities. This process operation results in the formation of a cavity 115 above each of the recessed lower portions 108X of the final gate structures 108. The amount of recessing of the materials of the lower portion 108X of the final gate structures 108 may vary depending upon the particular application. In one illustrative embodiment, based upon current-day technology, the materials of the lower portion 108X of the final gate structures 108 may be recessed such that the cavity 115 has a depth of about 20-80 nm.

Figure 8:
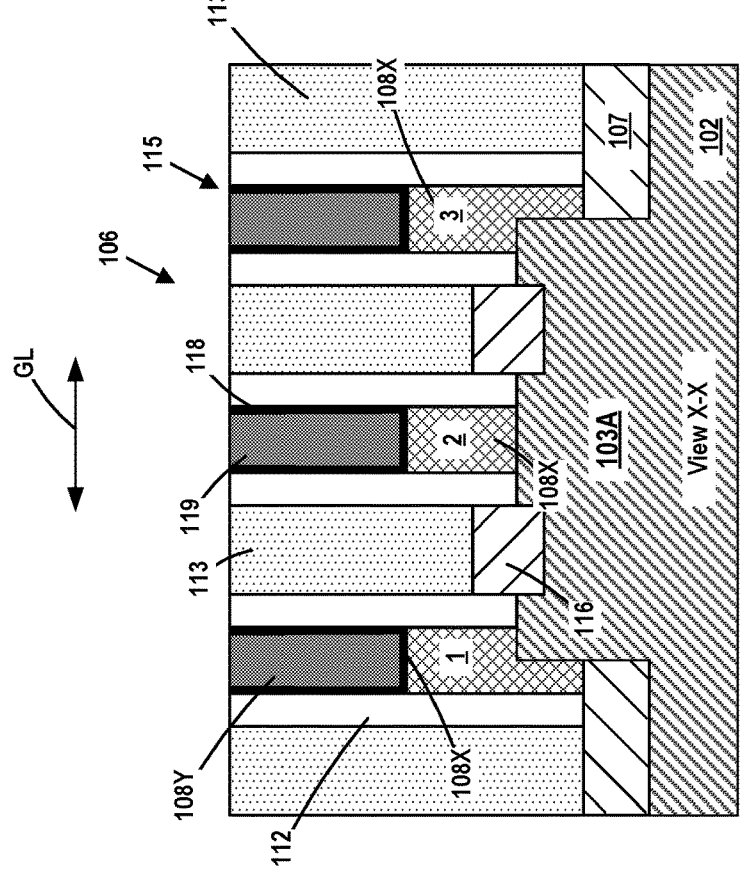

FIGS. 7-8 depict the product 100 after several process operations were performed to form a conductive upper portion 108Y of the final gate structures 108. As depicted, the upper portion 108Y of the final gate structures 108 is conductively coupled to the recessed lower portion 108X of the final gate structures 108. Collectively, the upper portion 108Y (recessed as described below) and the recessed lower portion 108X constitute the final gate structure 108 of the transistor device. In one illustrative process flow, the upper portion 108Y of the final gate structures 108 comprises one or more conductive materials that constitute a portion of the conductive gate electrode of the final gate structures 108. The upper portion 108Y of the final gate structures 108 may be comprised of a variety of different materials. In one illustrative example, the upper portion 108Y of the final gate structures 108 may comprise a conformal layer of conductive material 118 and a bulk layer of conductive material 119. In one particular example, the conformal layer of conductive material 118 may comprise, e.g., cobalt, a metal, a metal-alloy, etc., and it may be formed to any desired thickness, e.g., 1-5 nm. In one particular example, the bulk layer of conductive material 119 may comprise, e.g., tungsten, a metal, a metal compound, etc. The upper portion 108Y of the final gate structures 108 may be formed by performing a conformal deposition process to form the conformal layer of conductive material 118 across the product 100 and in the cavities 115, followed by performing a blanket-deposition process so as to over-fill the remaining un-filled portions of the cavities 115. Thereafter, a CMP and/or etch-back process was performed to planarize the upper surface of the product 100 with the upper surface of the spacers 112 and insulating material 113 so as to thereby remove the portions of the materials of the upper portion 108Y of the final gate structures 108 positioned outside of the gate contact cavities 115.

FIGS. 9-10 depict the product 100 after one or more recess etching processes were performed to reduce the height or recess the materials of the upper portion 108Y of the final gate structures 108 positioned above the recessed lower portion 108X of the final gate structures 108. This results in the formation of a plurality of recessed upper portions 108YR with a smaller cavity 115A positioned above the recessed upper portions 108YR. The amount of recessing of the upper portions 108Y may vary depending upon the particular application. In one illustrative embodiment, based upon current-day technology, the upper portions 108YR may be recessed such that the cavity 115A has a depth of about 10-40 nm.

Figure 11:
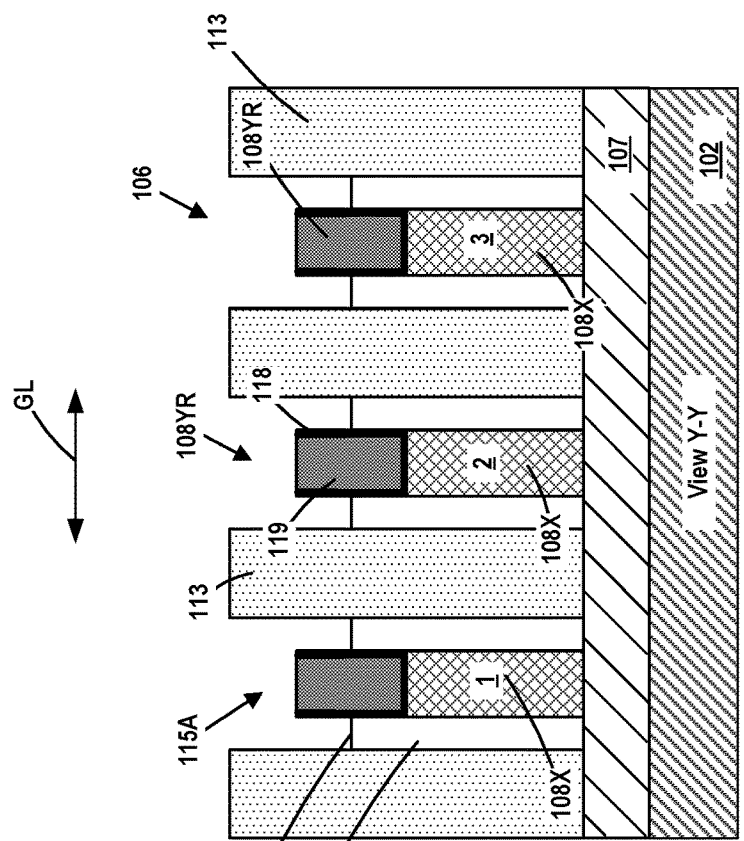
Figure 12:
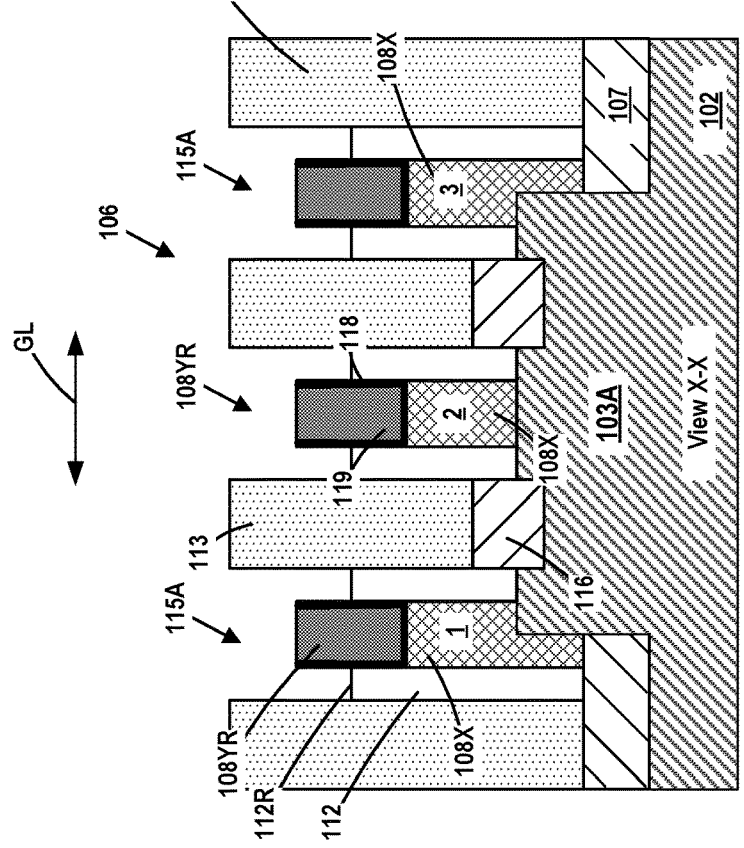

FIGS. 11-12 depict the product 100 after one or more recess etching processes were performed to reduce the height of the spacers 112 such that they have a recessed upper surface 112R. This results in the exposure of a portion of the sidewalls of the recessed upper portions 108YR of the final gate structure 108. The amount of recessing of the spacers 112 may vary depending upon the particular application. In one illustrative embodiment, the spacers 112 may be recessed about 5-20 nm.

FIGS. 13-14 depict the product 100 after a selective etching process was performed to remove the exposed portion of the conformal layer of conductive material 118 located above the recessed upper surface 112R of the spacers 112 selectively relative to the surrounding materials. This results in the exposure of a portion of the sidewalls of the bulk layer of conductive material 119 part of the recessed upper portions 108YR of the final gate structure 108. In one illustrative embodiment, this etching process may be an isotropic etching process.

FIGS. 15-16 depict the product 100 after an etching process 121 was performed on the exposed part of the bulk layer of conductive material 119 part of the recessed upper portions 108YR. This results in the formation of faceted surfaces 119A on the bulk layer of conductive material 119 part of the recessed upper portions 108YR. In the illustrative example where the bulk layer of conductive material 119 comprises tungsten, the etching process may be an isotropic reactive ion etching (ME) process performed using a chlorine-based etchant material. The etching process may be performed at a relatively low pressure (e.g., 0-30 Torr) so as to cause the materials of the conductive layer 119 near the outer edges of the conductive material 119 to etch at a relatively faster rate as compared to the material at the approximate middle of the conductive material 119 so as to thereby produce the approximate faceted surfaces 119A. The angle of the faceted surfaces 119A (relative to the horizontal) may vary depending upon the application (e.g., 25-45 degrees) and the parameters of the etching process 121.

FIGS. 17-18 depict the product 100 after final gate cap structures 123 were formed in the remaining un-filled portions of the cavities 115A above the recessed upper portions 108YR and above the recessed upper surface 112R of the spacers 112. The final gate cap structures 123 may be comprised of a material such as silicon nitride. The final gate cap structures 123 may be formed by blanket-depositing the material for the final gate cap structures 123 across the product 100 and in the cavities 115A and thereafter performing a CMP and/or etch-back process to remove excess amounts of the gate cap material positioned outside of the cavities 115A.

Figures 19, 20:
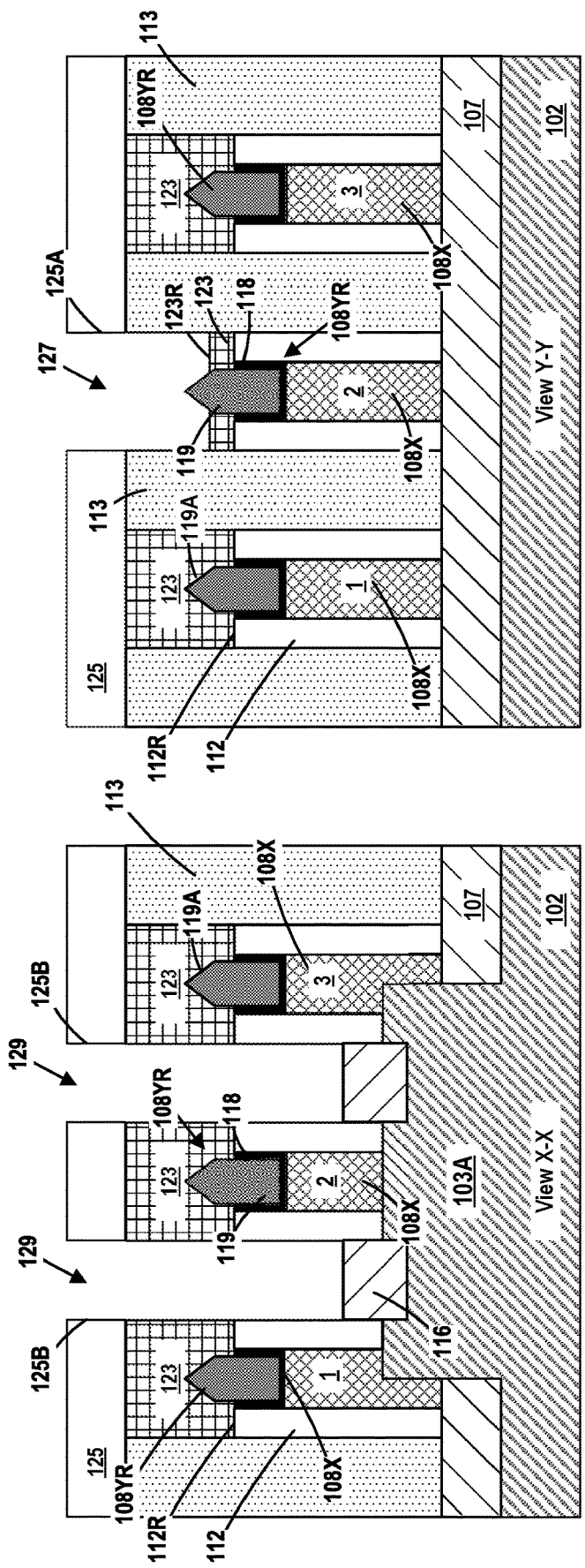

FIGS. 19-20 depict the product 100 after several process operations were performed. First, a patterned etch mask 125, e.g., a patterned OPL layer or photoresist, was formed on the product 100. The patterned etch mask 125 comprises an opening 125A at the location 110 (see FIG. 1) wherein it is desired to form a lower gate contact to gate 2. The patterned etch mask 125 also comprises a plurality of openings 125B at locations where it is desired to remove the insulating material 113 selectively relative to the surrounding materials and thereafter form source/drain metallization structures— conductive source/drain structures 120—at locations where the insulating material 113 was removed. Then, in one illustrative process flow, a timed etching process was performed to remove a portion of the initial thickness of the final gate cap structure 123 beneath the opening 125A in the patterned etch mask 125. This process operation effectively recesses the exposed portion of the final gate cap structure 123 such that it has a recessed upper surface 123R and exposes a portion of the recessed upper portion 108YR of gate 2 under the opening 125A and forms a lower gate contact opening 127. Thereafter, another etching process was performed through the openings 125B in the patterned etch mask 125 to remove the underlying insulating material 113 and the contact etch-stop layer (not shown) so as to thereby expose the epi semiconductor materials 116 in the source/drain regions of the transistor devices. These process operations define a plurality of source/drain contact openings 129. In the depicted example, a process flow was described whereby two separate etching processes were performed through a single patterned etch mask 125. If desired, two separate etch masks may be formed above the product and two separate etching processes may be performed to form the lower gate contact opening 127 and the source/drain contact openings 129.

FIGS. 21-22 depict the product 100 after various process operations were performed to form a lower gate contact 130 (in the lower gate contact opening 127) to gate 2 and the illustrative conductive source/drain structures 120A-B (e.g., trench silicide structures—collectively referenced using the numeral 120) in the source/drain contact openings 129. The conductive source/drain structures 120 are conductively coupled to the epi semiconductor material 116 in the source/drain regions of the transistor device (and in other areas where the insulating material 113 was removed). As depicted, in one illustrative process flow, the upper surface 130S of the lower gate contact 130, the upper surface 120S of the conductive source/drain structures 120 and the upper surface 123S of the final gate caps 123 are all substantially planar with one another. As shown in FIG. 1, the conductive source/drain structures 120 may extend at least for substantially the entire dimension of the active region in the gate width (GW) direction of the transistor device (into and out of the plane of the drawing page in FIG. 21). In one illustrative embodiment, the lower gate contact 130 and the conductive source/drain structures 120 may comprise a variety of different conductive materials, e.g., tungsten, cobalt, aluminum, a metal, a metal compound, cobalt silicide, nickel silicide, titanium silicide, nickel platinum silicide, etc. As indicated, in one illustrative process flow, the lower gate contact 130 and the conductive source/drain structures 120 are formed at the same time by performing various process operations. First, the patterned etch mask 125 (see FIGS. 19-20) was removed. Then, the material(s) for the lower gate contact 130 and the conductive source/drain structures 120 was formed above the product 100 so as to over-fill the lower gate contact opening 127 and the source/drain contact openings 129. At that point, one or more CMP and/or etch-back processes were performed to planarize the upper surface of the product 100 and remove excess amounts of the material(s) for the lower gate contact 130 and the conductive source/drain structures 120 that was positioned outside of the lower gate contact opening 127 and the source/drain contact openings 129.

At the point of processing depicted in FIGS. 21-22, the fabrication of the product 100 may be completed by performing traditional manufacturing techniques to form various standard features on the IC product 100. For example, one or more layers of insulating material 131 may be formed on the product 100 followed by performing one or more CMP processes. At that point, traditional manufacturing operations may be performed to form various device level contact structures. More specifically, a gate contact 132 may be formed to conductively contact the lower gate contact 130 and a plurality of source/drain contacts 133 may be formed to conductively contact the conductive source/drain structures 120. Thereafter, one or more metallization layers (not shown), that constitute the overall wiring pattern for the integrated circuit product 100, were formed on the product 100 by performing traditional manufacturing processes. These metallization layers are typically comprised of layers of insulating material with conductive metal lines or conductive vias formed in the layers of material. The first metallization layer in an integrated circuit product is typically referred to as the "M1" layer (or in some cases the "M0" layer), while the conductive vias that are used to establish electrical connection between the M1 layer and lower level conductive structures are typically referred to as "V0" vias.

Figure 24:
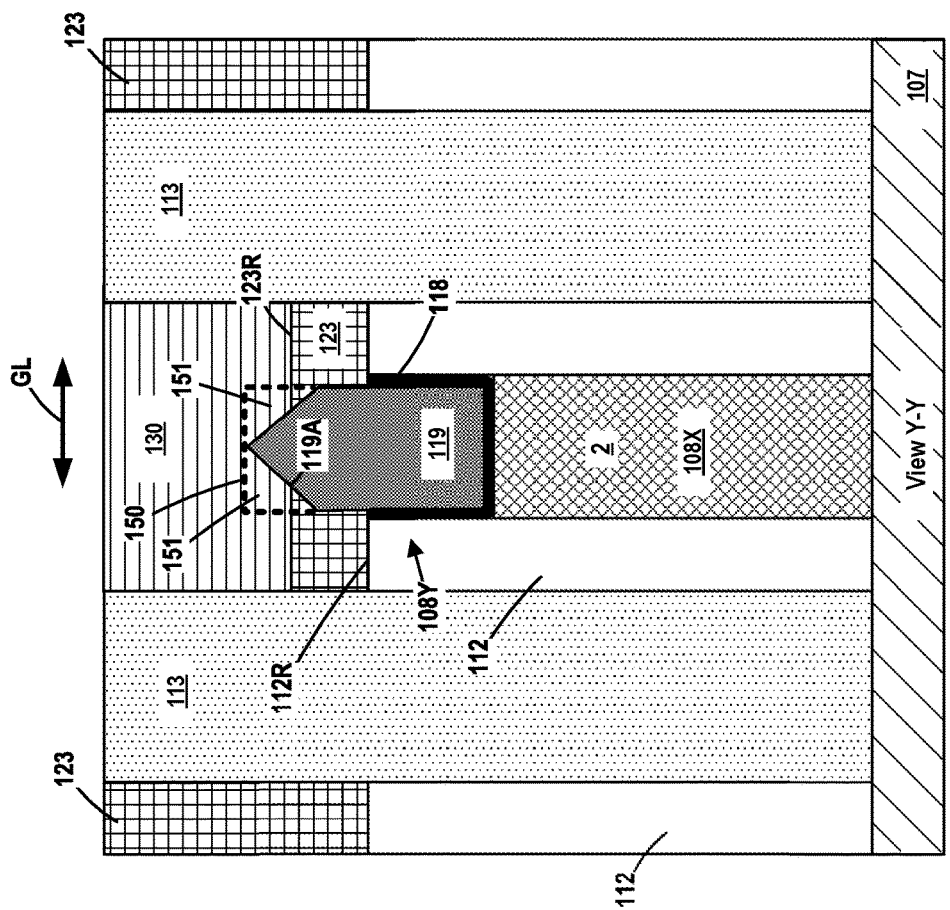
Figure 23:
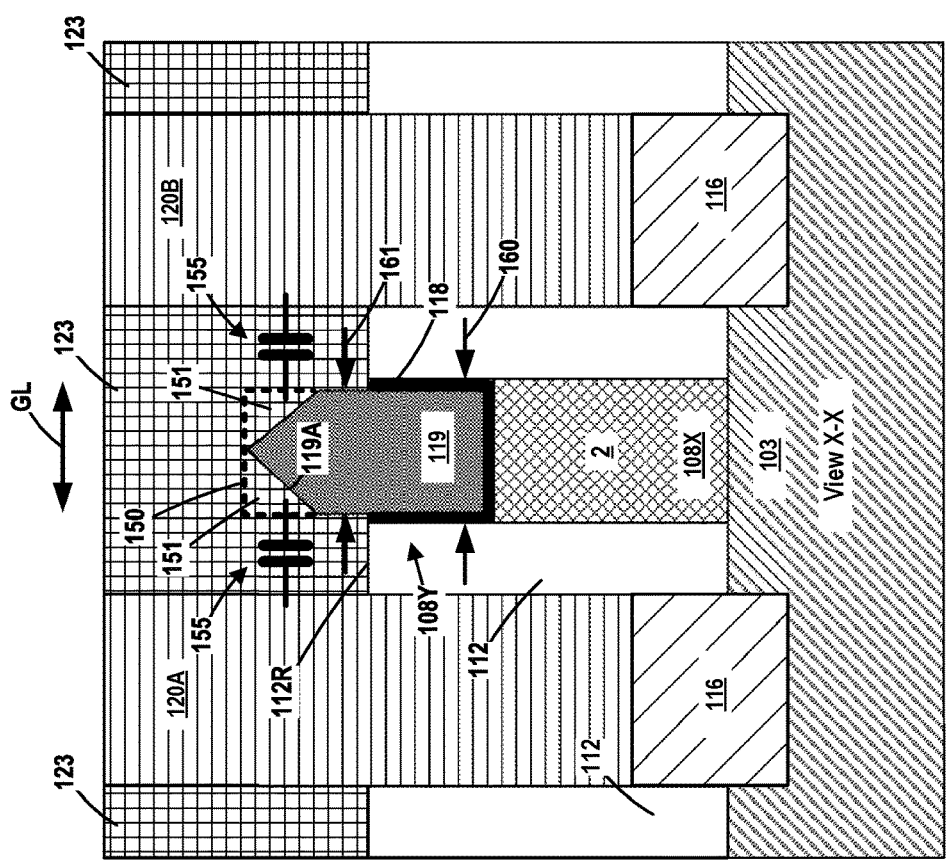

FIG. 23-24 are enlarged images of the gate structure 108. As depicted, when viewed in a cross-section taken through the gate structure 108 for gate 2 in a direction corresponding to the gate-length ("GL") direction of the device, the upper portion 108Y has a tapered upper surface comprised of the faceted surfaces 119A that intersect one another at the uppermost part of the tapered upper surface of the upper portion 108Y. FIG. 23 depicts the gate structure 108 for gate 2 at a point over the active region of the transistor device, while FIG. 24 depicts the gate structure 108 for gate 2 at a point over the isolation material 107 outside of the active region. The dashed line 150 represents the cross-sectional configuration of the trimmed upper portion 108YR as shown in FIGS. 13-14, e.g., before performing the etching process 121 schematically depicted in FIGS. 15-16. Performing the etching process 121 to form the tapered upper surface of the upper portion 108Y effectively removes the conductive material of the upper portion 108Y of the gate structure 108 in the triangular shaped regions 151. Of course, as will be appreciated by those skilled in the art, the depicted cross-sectional configurations of the gate structure 108 are substantially the same along the axial length of the gate structure 108, i.e., in the direction into and out of the plane of the drawing page or the gate-width direction of the device. By removing these areas of conductive material, the parasitic capacitive coupling (indicated at 155) between the gate structure 108 and the conductive source/drain structures 120 when the device is operated may be effectively reduced thereby tending to improve the operational characteristics of the transistor device. Additionally, by forming the tapered upper surface on the upper portion 108Y of the gate structure 108, there may be less of a tendency to form undesirable gate-to-source/drain electrical shorts, i.e., conductive stringers. Such undesirable electrical shorts, when present, may impair device performance of, or in a worst-case situation, render the device inoperable. It should also be noted that the conductive upper portion 108Y has a greater lateral width 160 below the recessed upper surface 112R of the spacer 112 as compared to the lateral width 161 of the conductive upper portion 108Y above the recessed upper surface 112R of the spacer 112 due to removal of portions of the conformal conductive layer 118 from the sidewalls of the material 119 above the recessed upper surface 112R. The difference between the dimensions 160, 161 may vary depending upon the particular application, e.g., 2-10 nm.

As noted above, FIG. 2 depicts an alternative embodiment of the integrated circuit product 100 wherein an elongated source/drain metallization or contact structure 120A was formed in the space between gates 1 and 2, wherein a portion of the elongated source/drain metallization or contact structure 120A is positioned laterally adjacent gate 2 and above the isolation material 107. Such a configuration may arise in a product 100 wherein the conductive source/drain structure 120A was formed so that it extends across the source/drain regions of multiple separate transistor devices (the second transistor device is not shown) as well as across the isolation material 107 positioned between the separate transistors. FIGS. 25-28 depict the product 100 wherein a combined gate/SD contact structure 140 (e.g., a cross-coupled contact structure) will be formed to conductively couple to the gate structure 108 of gate 2 and to the elongated source/drain metallization or contact structure 120A. As noted above, the view Z-Z is a cross-sectional view taken through a location 111 (in dashed lines) along the axial length of gate 2 where the cross-coupled contact structure 140 (not shown in FIG. 2) will be formed. In general, the processing operations performed to form the second embodiment of the product 100 are substantially the same as those described above with respect to the formation of the first embodiment of the product 100 with only a few differences.

Figure 25:
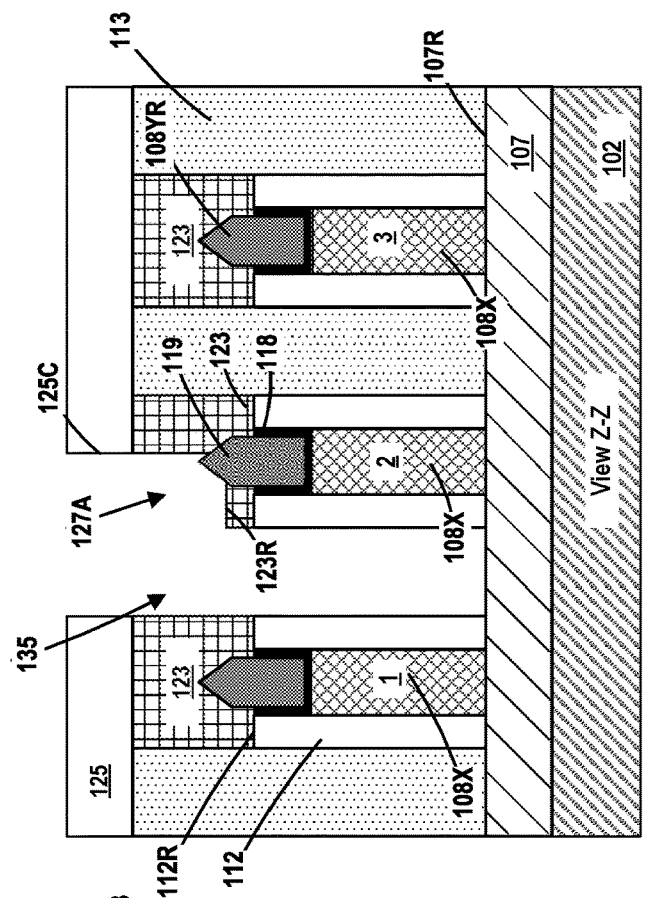
Figure 26:
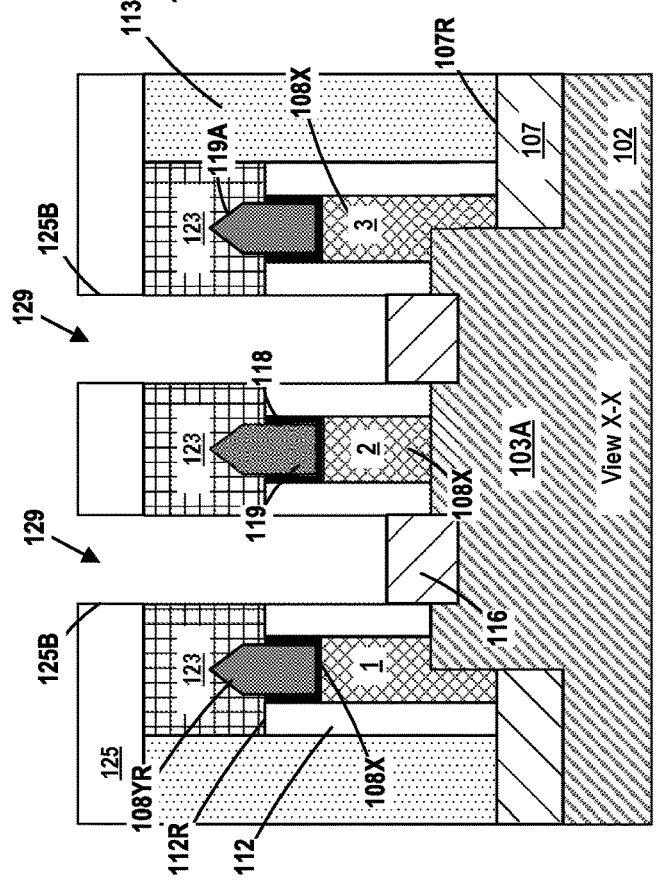

FIGS. 25-26 depict the product 100 after several process operations were performed. First, the above-described patterned etch mask 125 was formed on the product 100. However, in this embodiment, the patterned etch mask 125 comprises an opening 125C at the location 111 (see FIG. 2)

wherein it is desired to form the cross-coupled contact structure 140. The patterned etch mask 125 also comprises the above-described openings 125B. Then, in one illustrative process flow, a timed etching process was performed to remove a portion of final gate cap structure 123 beneath the opening 125C in the patterned etch mask 125. This process operation effectively recesses the exposed portion of the final gate cap structure 123 such that it has a recessed upper surface 123R and exposes a portion of the recessed upper portions 108YR of the final gate structure 108 for gate 2 under the opening 125C and forms a gate contact opening 127A. Thereafter, another etching process was performed through the openings 125B and 125C in the patterned etch mask 125 to remove the underlying insulating material 113 and the contact etch-stop layer (not shown) so as to thereby expose the epi semiconductor materials 116 in the source/drain regions of the transistor devices and remove the insulating material 113 between gates 1 and 2 above the isolation material 107 (see FIG. 26—view Z-Z). These process operations define a plurality of source/drain contact openings 129 as well as a cross-coupled contact structure opening 135 (that includes the gate contact opening 127A). As noted above, in other process flows, two separate patterned masking layers may be employed to form the openings 129 and the portion 127A of the opening 135.

FIGS. 27-28 depict the product 100 after various process operations were performed to form the cross-coupled contact structure 140 (in the opening 135) to gate 2 and the illustrative above-described source/drain structures 120 in the source/drain contact openings 129. As depicted, in one illustrative process flow, the upper surface 140S of the cross-coupled contact structure 140, the upper surface 120S of the conductive source/drain structures 120 and the upper surface 123S of the final gate caps 123 are all substantially planar with one another. The cross-coupled contact structure 140 may be comprised of the same materials as those described above with respect to the lower gate contact 130. As indicated, in one illustrative process flow, the cross-coupled contact structure 140 and the conductive source/drain structures 120 are formed at the same time by performing various process operations. First, the patterned etch mask 125 was removed. Then, material(s) for the cross-coupled contact structure 140 and the conductive source/drain structures 120 was formed above the product 100 so as to over-fill the opening 135 and the source/drain contact openings 129. At that point, one or more CMP and/or etch-back processes were performed to planarize the upper surface of the product 100 and remove excess amounts of the material(s) for the cross-coupled contact structure 140 and the conductive source/drain structures 120 that was positioned outside of the opening 135 and the source/drain contact openings 129. At the point of processing depicted in FIGS. 27-28, the fabrication of the product 100 may be completed by performing traditional manufacturing techniques to form various standard features on the IC product 100 as described above with respect to the first embodiment.

One illustrative method disclosed herein includes forming a gate structure 108 in a gate cavity 115 laterally defined by a sidewall spacer 112 and recessing the sidewall spacer so as to form a recessed sidewall spacer with a recessed upper surface 112R, wherein recessing the sidewall spacer exposes a portion 108Y of the gate structure 108 positioned above a level of the recessed upper surface 112R. In this example, the method also includes performing at least one etching process to form a tapered upper surface on the exposed portion of the gate structure 108 and forming a gate cap 123 that is positioned above the tapered upper surface of the gate structure 108 and above the recessed upper surface 112R of the recessed sidewall spacer 112.

One illustrative device disclosed includes a gate structure 108 and a sidewall spacer 112 positioned adjacent the gate structure, the sidewall spacer having an upper surface 112R, wherein an upper portion 108Y of the gate structure 108 is positioned above a level of the upper surface 112R of the sidewall spacer 112. In this illustrative example, the device also includes a tapered upper surface on the upper portion 108Y of the gate structure 108 and a gate cap 123, wherein the gate cap 123 is positioned above the tapered upper surface of the gate structure 108 and above the upper surface 112R of the sidewall spacer 112.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modi-fled and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required.

Accordingly, the protection sought herein is as set forth in the claims below.

What is claimed:

1. A method, comprising:
   forming a gate structure in a gate cavity laterally defined by a sidewall spacer;
   recessing said sidewall spacer so as to form a recessed sidewall spacer with a recessed upper surface, wherein recessing said sidewall spacer exposes a portion of said gate structure positioned above a level of said recessed upper surface;
   performing at least one etching process to form a tapered upper surface on said exposed portion of said gate structure; and
   forming a gate cap, said gate cap being positioned above said tapered upper surface of said gate structure and above said recessed upper surface of said recessed sidewall spacer.

2. The method of claim 1, wherein said gate structure comprises a conductive material having side surfaces and a bottom surface and a conformal layer of conductive material positioned on said side surfaces and said bottom surface of said conductive material, wherein performing said at least one etching process to form said tapered upper surface on said exposed portion of said gate structure comprises:
   performing a first etching process to remove said conformal layer of conductive material positioned on said side surfaces and above said level of said recessed upper surface so as to thereby expose said side surfaces of said conductive material; and
   performing a second etching process on said conductive material to form said tapered upper surface in said conductive material.

3. The method of claim 2, wherein said conformal layer of conductive material comprises one of cobalt, a metal or a metal-alloy, and said conductive material comprises one of tungsten, a metal or a metal compound.

4. The method of claim 2, wherein performing said first etching process comprises performing an isotropic etching process and performing said second etching process comprises performing an isotropic reactive ion etching process at a pressure falling within a range of 0-30 Torr.

5. The method of claim 1, wherein, after recessing said sidewall spacer, said exposed portion of said gate structure has a substantially planar upper surface.

6. The method of claim 5, wherein performing said at least one etching process removes material of said substantially planar upper surface so as to form said tapered upper surface.

7. The method of claim 1, wherein said tapered upper surface comprises a plurality of faceted surfaces that engage one another at an uppermost surface of said tapered upper surface.

8. The method of claim 1, wherein said gate structure is for a transistor device having a gate length direction and wherein a lower portion of said gate structure positioned below said level of said recessed upper surface has a first lateral width in said gate length direction, and an upper portion of said gate structure positioned above said level of said recessed upper surface has a second lateral width in said gate length direction, wherein said second lateral width is less than said first lateral width.

9. The method of claim 1, wherein said gate structure comprises a high-k (k value of 10 or greater) gate insulation layer and a gate electrode that comprises at least one metal-containing layer of material and at least on layer of a work-function adjusting metal layer, said sidewall spacer comprises one of silicon nitride or a low-k material (k value of 3.3 or less), said gate cap comprises silicon nitride and wherein said gate structure is for a FinFET device.

10. A method, comprising:
forming a gate structure in a gate cavity laterally defined by a sidewall spacer, wherein said gate structure comprises a conductive material having side surfaces and a bottom surface and a conformal layer of conductive material positioned on said side surfaces and said bottom surface of said conductive material;
recessing said sidewall spacer so as to form a recessed sidewall spacer with a recessed upper surface, wherein recessing said sidewall spacers exposes an upper portion of said gate structure positioned above a level of said recessed upper surface;
performing a first etching process to remove said conformal layer of conductive material positioned on said side surfaces and above said level of said recessed upper surface so as to thereby expose said side surfaces of said conductive material of said upper portion of said gate structure;
performing a second etching process on said conductive material to form a tapered upper surface in said conductive material of said upper portion of said gate structure; and
forming a gate cap, said gate cap being positioned above said tapered upper surface of said upper portion of said gate structure and above said recessed upper surface of said recessed sidewall spacer.

11. The method of claim 10, wherein performing said first etching process comprises performing an isotropic etching process.

12. The method of claim 10, wherein performing said second etching process comprises performing an isotropic reactive ion etching process at a pressure falling within a range of 0-30 Torr.

13. The method of claim 11, wherein, after recessing said sidewall spacer, said exposed portion of said upper portion of said gate structure has a substantially planar upper surface.

14. The method of claim 13, wherein said tapered upper surface comprises a plurality of faceted surfaces that engage one another at an uppermost surface of said tapered upper surface.

15. The method of claim 11, wherein said tapered upper surface comprises a plurality of faceted surfaces that engage one another at an uppermost surface of said tapered upper surface.

16. The method of claim 11, wherein said gate structure is for a transistor device having a gate length direction and wherein a lower portion of said gate structure positioned below said level of said recessed upper surface has a first lateral width in said gate length direction, and said upper portion of said gate structure has a second lateral width in said gate length direction, wherein said second lateral width is less than said first lateral width.

* * * * *